United States Patent [19]
Hori

[11] Patent Number: 5,625,188
[45] Date of Patent: Apr. 29, 1997

[54] PYROELECTRIC INFRARED ARRAY SENSOR

[75] Inventor: Kenji Hori, Kyoto, Japan

[73] Assignee: Murata Manufacturing Co., Ltd., Japan

[21] Appl. No.: 329,333

[22] Filed: Oct. 26, 1994

[30] Foreign Application Priority Data

Oct. 29, 1993 [JP] Japan ................................. 5-272219
Dec. 3, 1993 [JP] Japan ................................. 5-071171

[51] Int. Cl.$^6$ ................................................. G01J 5/10
[52] U.S. Cl. ........................................ 250/338.3; 250/349
[58] Field of Search ........................... 250/338.2, 338.3, 250/332, 349

[56] References Cited

U.S. PATENT DOCUMENTS 3,581,092  5/1971  Pearsall et al. ........................... 250/349
5,130,542  7/1992  Sibbald et al. ........................ 250/338.3

FOREIGN PATENT DOCUMENTS

0345047  12/1989  European Pat. Off. .
59-159032  9/1984  Japan ..................................... 250/349
60-69524  4/1985  Japan ................................. 250/338.3
61-193030  8/1986  Japan ................................. 250/338.3
2150747  7/1985  United Kingdom .

Primary Examiner—Edward J. Glick
Attorney, Agent, or Firm—Ostrolenk, Faber, Gerb & Soffen, LLP

[57] ABSTRACT

A pyroelectric infrared array sensor has a pyroelectric element on which a plurality of sensing sections are formed each of which is made up of a pair of electrodes confronted with each other. In fixedly securing the pyroelectric element to a substrate, lead conductors extended from the sensing sections located adjacent to the edges of the light receiving surface of the pyroelectric element are fixedly connected to the substrate by using conductive paste.

15 Claims, 7 Drawing Sheets

PYROELECTRIC INFRARED ARRAY SENSOR

BACKGROUND OF THE INVENTION

1. Field of the Invention

This invention relates to a pyroelectric infrared array sensor which senses infrared rays from a human body to give an alarm signal.

2. Description of the Related Art

A pyroelectric infrared array sensor utilizes a sensing element comprising a material such as PZT (lead zirconate titanate) having a pyroelectric effect. The term "pyroelectric effect" as used herein is intended to mean the characteristic that, when infrared rays are applied to the sensing element, the surface temperature of the latter is changed, as a result of which the charges therein are no longer in the state of neutralization; that is, the element becomes electrically unbalanced, thus producing charges. The charges thus produced can be converted to a voltage by an impedance.

Figure 1:
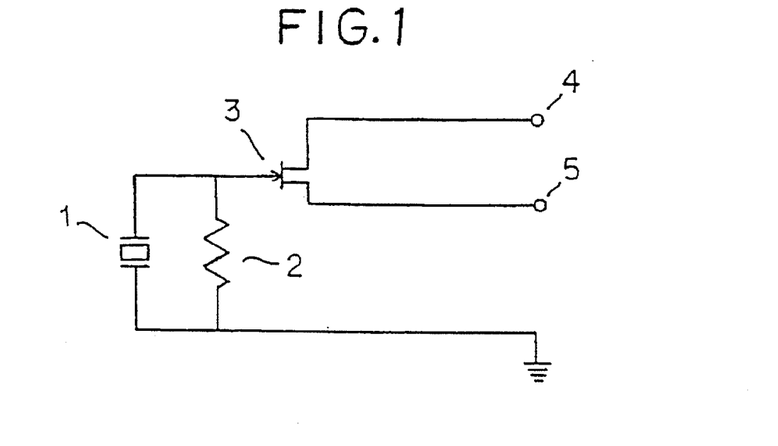
FIG. 1 is a general circuit diagram of a pyroelectric infrared array sensor.

An equivalent circuit of the pyroelectric infrared array sensor is, for instance, as shown in FIG. 1. A sensing section 1 is formed on a pyroelectric element, and is connected in parallel to a high-resistance chip 2. One of the terminals of the high-resistance chip 2 is connected to the gate terminal of an FET (field-effect transistor), and the other terminal is grounded. When a positive voltage is applied to a drain terminal pin 4 connected to the drain terminal of the FET 3, charges produced in response to the application of infrared rays to the sensing section 1 can be obtained as a voltage output at a source terminal pin 5 connected to the source terminal of the FET 3.

This characteristic is utilized to provide a pyroelectric infrared linear array sensor in which a plurality of sensing sections are arranged in a line, or a pyroelectric infrared two-dimensional array sensor in which a plurality of sensing sections are arranged two-dimensionally. Those sensors are used for detecting the direction of movement or position of a person or the like.

Figure 2:
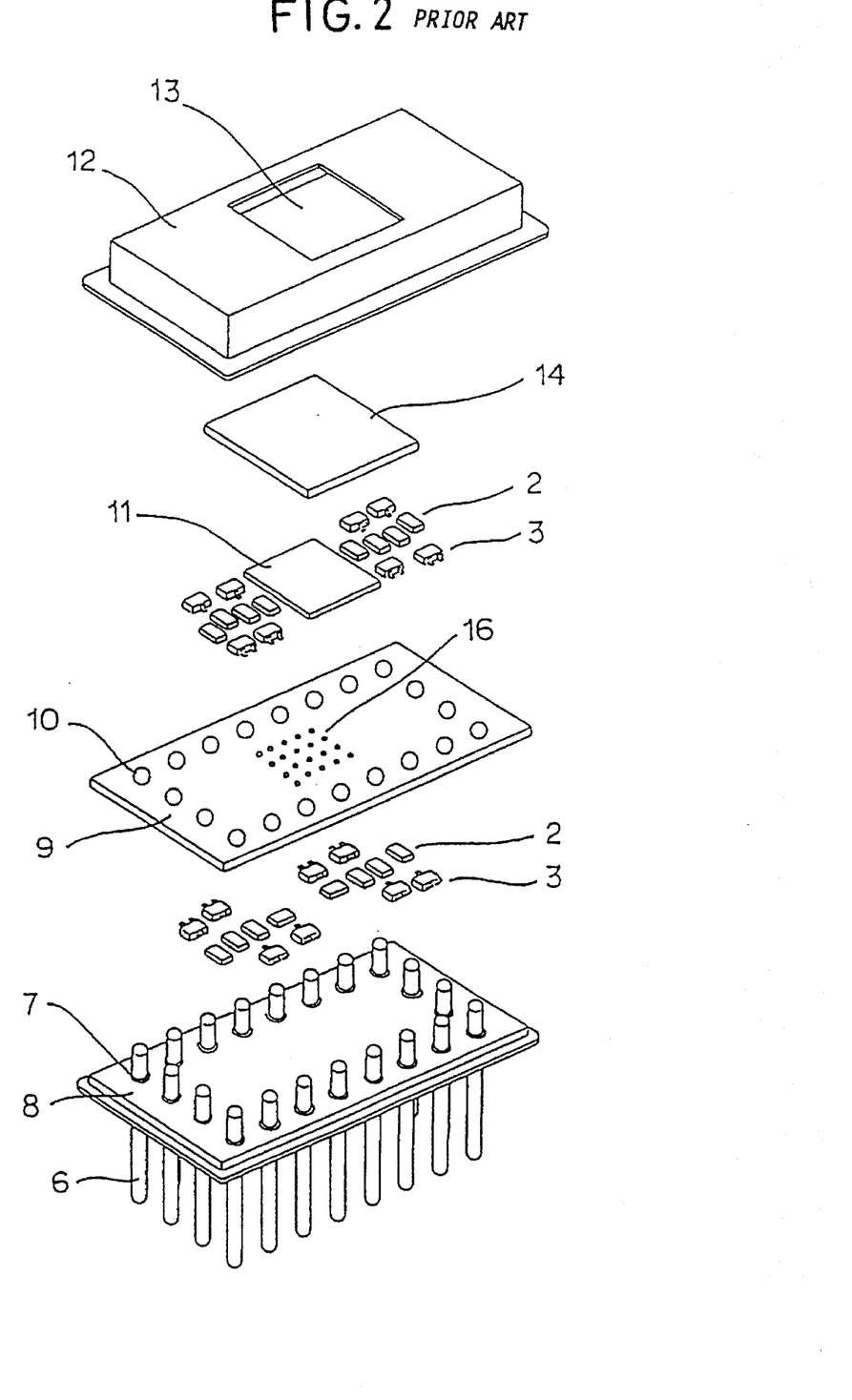
FIG. 2 is an exploded perspective view showing a conventional current collection type infrared array sensor.

FIG. 2 is an exploded perspective view of the pyroelectric infrared array sensor. Terminal pins 6 are embedded in a metal header 8 in such a manner that they penetrate the header 8 through insulating cylindrical pieces 7. A grounding pin (not shown) is formed as follows: With conductive paste applied to the insulating cylindrical piece 7 of a selected one of the terminal pins 6, the terminal pin 6 is shorted to the metal header 8, to form the desired grounding pin.

The terminal pins 6 protruded from the upper surface of the metal header 8 are inserted into holes 10 formed in a substrate 9, respectively, and fixedly connected to lands (not shown) which are connected to a circuit (not shown) formed around the holes 10.

A pyroelectric element 11 is mounted on the upper surface of the substrate 9, and high-resistance chips 2 and FETs 3 are mounted on the upper and lower surfaces of the substrate 9. The number of the high-resistance chips 2 and that of the FETs 3 are equal to the number of the sensing sections.

A casing 12 has an opening 13 which confronts the pyroelectric element 11. The opening 13 is closed with an infrared filter 14.

The metal header 8 is electrically welded to the casing 12, so that the header 8 is electrically connected to the casing 12.

Figure 3:
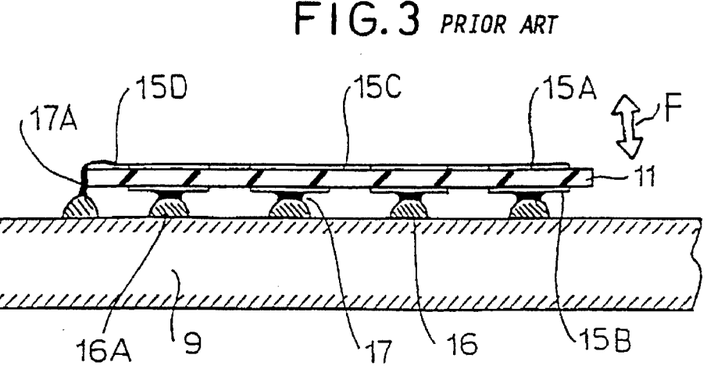
FIG. 3 is a sectional view showing a pyroelectric element mounted on a substrate in the conventional pyroelectric infrared array sensor.

The pyroelectric element 11 is polarized in advance so that its one side is positive, and the other side is negative. The light receiving surface of the pyroelectric element 11 is confronted with the infrared filter 14 which is perpendicular to the axis of polarization. As shown in FIG. 3, a plurality of electrodes 15A are provided on the light receiving surface of the pyroelectric element 11, and a plurality of electrodes 15B are provided on the opposite surface of the element 11 in such a manner that the electrodes 15B are confronted through the element 11 with the electrodes 15A, respectively, thus providing a plurality of sensing sections each including a pair of electrodes 15A and 15B. The electrodes 15A of the sensing sections are connected to one another with connecting conductors 15C. In addition, lead conductors 15D are formed on the element 11; that is, the electrodes 15A thus connected to each other are connected to the circuit on the substrate 9 through the lead conductors 15D. The electrodes 15A and 15B, the connecting conductors 15C, and the lead conductors 15D are formed by vapor deposition of NiCr, Ag, Ag—Cu or the like. In the case where the electrodes 15A and 15B are of Ag or Ag—Cu, a black film is formed on the surface of each of the electrodes 15A, which absorbs heat with high efficiency.

In order to prevent heat generated at the sensing sections of the pyroelectric element 11 from flowing to the substrate 9, the pyroelectric element 11 is held spaced from the substrate 9; that is, it is secured by the electrodes 15B to solder bumps 16 formed on the circuit on the substrate 9 by using conductive paste 17. Each of the electrodes 15B is connected through the circuit on the substrate 9 to one terminal of the respective high-resistance chip 2 and to the gate terminal of the respective FET 3. The electrodes 15A, which are connected to one another with the connecting conductors 15C, are fixedly connected through the lead conductors 15D to conductive parts such as the solder bumps on the circuit of the substrate 9 by using the conductive paste 17A, and connected to the grounding pin and to the remaining terminals of the high-resistance chips 2. The drain terminals and source terminals of the FETs 3 are connected to predetermined ones of the terminal pins 6.

Charges produced by the plurality of sensing sections of the pyroelectric element 11 are obtained as voltage by a plurality of impedance conversion circuits made up of the FETs 3. By comparing the different outputs of the plurality of sensing sections with one another, the direction of movement or position of a person or the like can be detected.

Figure 4A:
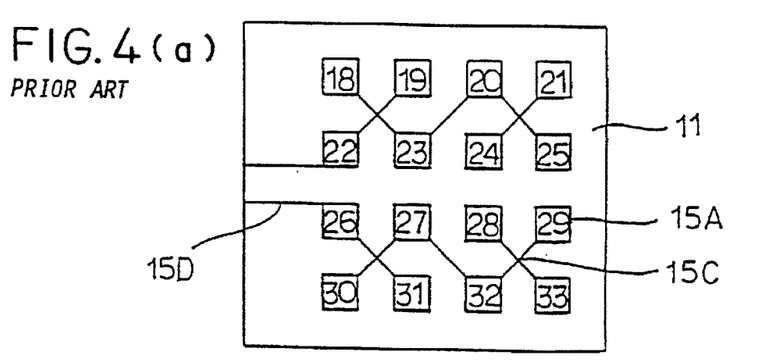
FIGS. 4(a) and 4(b) are a top view and a bottom view showing a pyroelectric element in a conventional current collection type infrared two-dimensional array sensor, respectively.
Figure 4B:
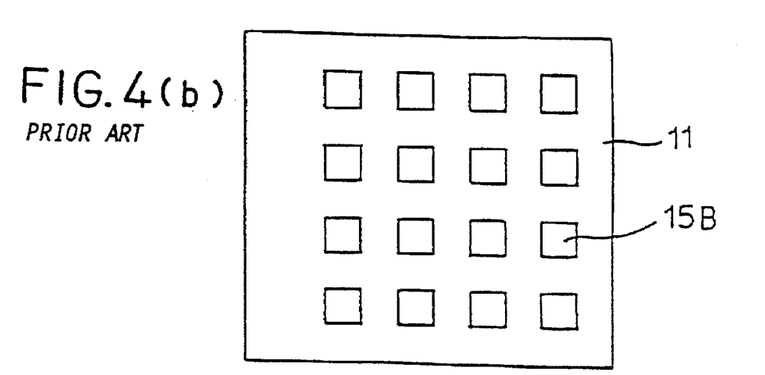

In the case of a pyroelectric infrared two-dimensional array sensor which includes sixteen (4×4) sensing sections 18 through 33 as shown in FIGS. 4(a) and 4(b), the sensing sections 18, 21, 30 and 33 at the four corners are each adjacent to two sides of the rectangular pyroelectric element 11, and therefore they are high in thermal resistance. Hence, it is difficult for the heat generated at those sensing sections by infrared rays to diffuse. The sensing sections 19, 20, 22, 25, 26, 29, 31 and 32 are provided along respective sides of the pyroelectric element 11. Therefore, the heat generated at the sensing sections 19, 20, 22, 25, 26, 29, 31 and 32 is less diffused than the heat generated in the sensing sections 18, 21, 30 and 33. Hence, the sensing sections 18, 21, 30 and 33 are highest in sensitivity, and the sensing sections 19, 20, 22, 25, 26, 29, 31 and 32 are next.

However, the pyroelectric infrared two-dimensional array sensor is not able to deal with this variation in sensitivity. Hence, in application of the sensor, the amplification factors of the amplifier circuits for all the sensing sections are adjusted; in other words, the adjustment is carried out for every sensing section, which takes a lot of time and labor, and increases the manufacturing cost of the sensor.

Figure 5A:
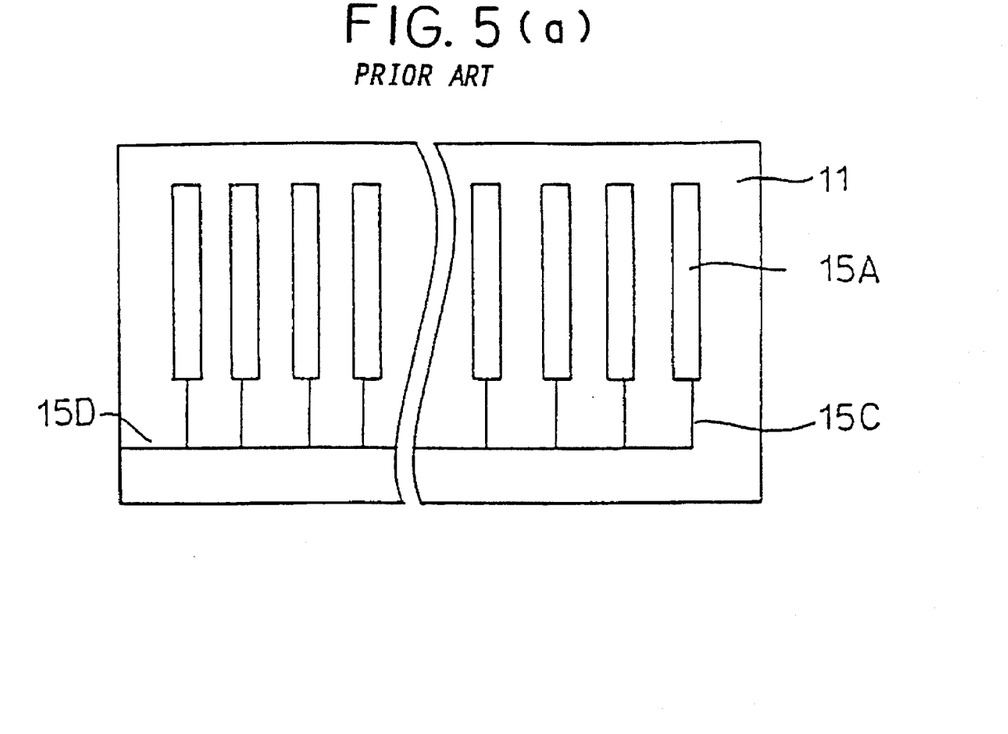
FIGS. 5(a) and 5(b) are a top view and a bottom view showing a pyroelectric element in a conventional pyroelectric infrared linear array sensor, respectively.
Figure 5B:
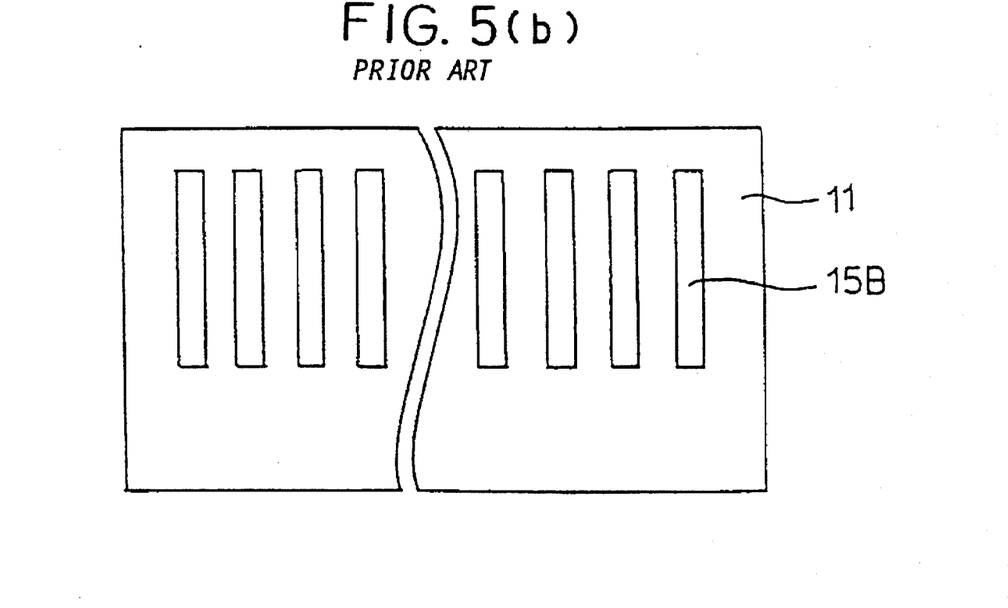

In a pyroelectric infrared linear array sensor as shown in FIGS. 5(a) and 5(b) in which a plurality of sensing sections are arranged one-dimensionally, as in the case of the pyroelectric infrared two-dimensional array sensor, the sensing sections at both ends of the pyroelectric element 11 are highest in sensitivity, and the remaining sensing sections are lower in sensitivity towards the middle of the pyroelectric element 11.

Hence, the sensing sections at both ends of the pyroelectric element 11 are employed as dummy sensing sections, or they are positioned away from both ends of the element 11, which results in an increase in size of the element 11. Hence, it is impossible to miniaturize the pyroelectric infrared linear array sensor.

Further, the above-described conventional pyroelectric infrared array sensor suffers from the following difficulties: In the conventional sensor, referring again to FIG. 3, when temperature is changed, the conductive paste 17A is expanded or contracted. In this case, the conductive paste 17A is provided only at one position as was described above. Hence, in response to the expansion or contraction of the conductive paste 17A, a great stress is applied to the pyroelectric element 11 in the direction of the arrow F, with the bump 16A closest to the conductive paste 17A as a fulcrum as shown in FIG. 3. As a result, the solder bumps 16 of the sensing sections elements may be cracked at the connecting points or may come off, thus impairing the reliability of the infrared array sensor.

In addition, depending on how the solder bumps are cracked at the connecting points or come off, the electrical conduction between the pyroelectric element 11 and the substrate 9 is deteriorated, which increases noise and lowers the sensitivity of the sensor.

SUMMARY OF THE INVENTION

In view of the foregoing, an object of the invention is to provide a pyroelectric infrared array sensor in which a plurality of sensing sections have reduced variation in sensitivity.

The foregoing object of the invention has been achieved by the provision of a pyroelectric infrared array sensor comprising: a pyroelectric element on which a plurality of sensing sections are provided each of which is made up of a pair of electrodes which are confronted with each other, and produces charges according to heat generated by infrared rays applied thereto; and a substrate to which the pyroelectric element is fixedly secured, wherein, on the light receiving surface of the pyroelectric element, connecting conductors and lead conductors are provided in such a manner that the plurality of sensing sections are connected to one another through the connecting conductors, and the lead conductors are extended from the sensing sections which are located adjacent to the edges of the light receiving surface of the pyroelectric element, and the lead conductors are fixedly connected to the substrate with conductive paste.

Further, the foregoing object of the invention has been achieved by the provision of a pyroelectric infrared array sensor in which a plurality of grounding electrodes are arranged in a two-dimensional array on one surface of a pyroelectric element and are conductively connected to one another, and a connecting section of conductive adhesive agent is provided on a grounding electrode forming surface of the pyroelectric element through which the grounding electrodes are connected to an external ground potential; wherein a plurality of connecting sections of conductive adhesive agent are arranged symmetrical at least on the front and rear edges, or on the right and left edges, or at both ends of a diagonal line of the grounding electrode forming surface of the pyroelectric element.

The conductive paste used for fixedly securing each of the sensing sections formed on the pyroelectric element to the substrate is used as a heat sink and a thermal conduction path, which enhances the diffusion of heat generated at the sensing sections by infrared rays applied thereto, and increases the thermal conduction to the substrate. Thus, the charges produced by the sensing sections are uniform.

In the pyroelectric infrared array sensor of the invention, a plurality of grounding electrodes are arranged in a two-dimensional array on one surface of the pyroelectric element substrate, and a plurality of connecting sections of conductive adhesive agent are arranged symmetrical on the front and rear edges, or on the right and left edges, or at both ends of a diagonal line of the grounding electrode forming surface of the pyroelectric element. When the connecting sections of conductive adhesive agent are affected by external thermal change, they are thermally expanded or contracted. The stresses due to the expansion or contraction of the conductive adhesive agent which are applied to the picture elements are made substantially uniform, or averaged, because the connecting sections applied with the conductive adhesive agent are arranged symmetrical as described above. That is, the stresses applied to the connecting points of the solder bumps are reduced, which prevents the solder bumps of the picture elements from being cracked at the connecting points or coming off. Accordingly, in the sensor, noise is never increased, and its sensitivity is never lowered. Therefore, with the sensor of the invention, a heat source can be detected with high accuracy.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

FIGS. 8 (a) to 8(d) are perspective views showing examples of pyroelectric elements according to a third embodiment of the invention, respectively.

DETAILED DESCRIPTION OF THE PREFERRED EMBODIMENTS

Figure 6A:
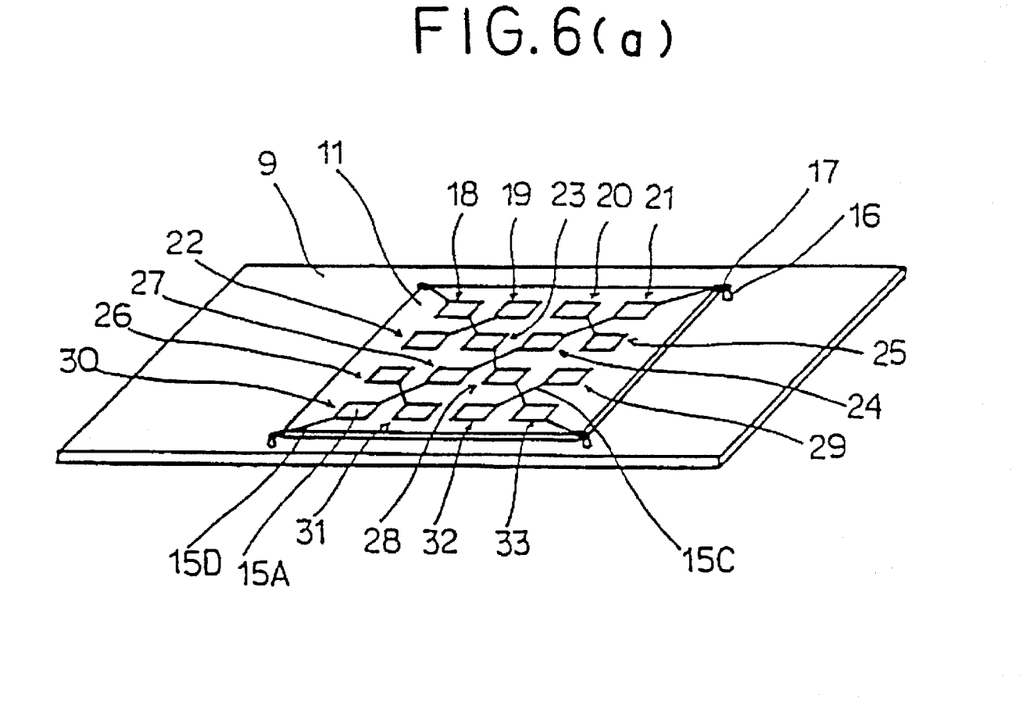
FIGS. 6(a) and 6(b) are a perspective view and a sectional view showing a pyrolectric infrared two-dimensional array sensor in which a pyroelectric element is mounted on a substrate according to an embodiment of the invention, respectively.
Figure 6B:
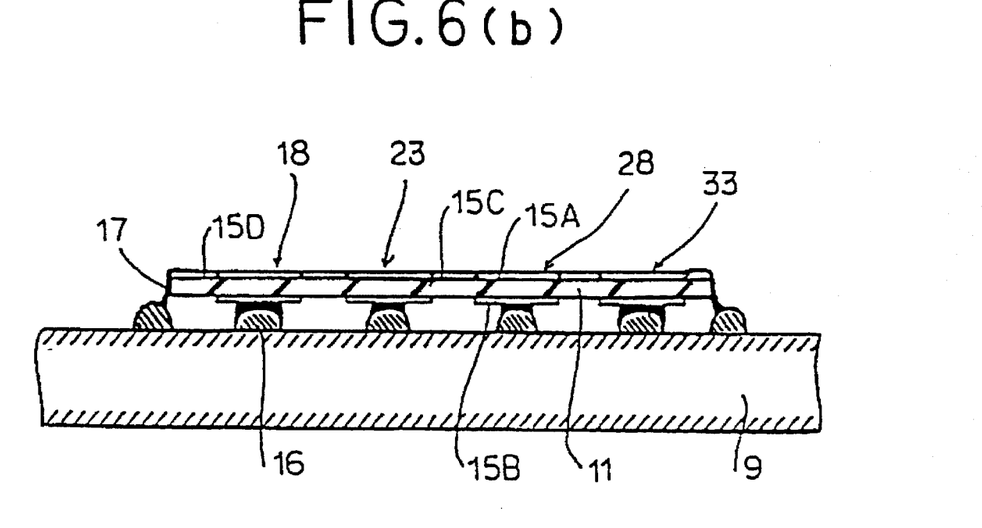

FIGS. 6(a) and 6(b) show a pyroelectric infrared two-dimensional array sensor made up of sixteen (16) sensing sections in accordance with a first embodiment of the invention. The sensor is different from the above-described conventional one only in a substrate 9 and a pyroelectric element 11. In the pyroelectric element 11, the sensing sections have the same reference numerals as those in the conventional sensor.

As shown in FIGS. 6(a) and 6(b), in the pyroelectric infrared two-dimensional array sensor having sixteen (16) sensing sections 18 to 33, sixteen (16) electrodes 15A are arranged in matrix form, 4×4, at equal intervals on the upper surface of the pyroelectric element 11, and sixteen electrodes 15B are arranged on the lower surface of the element 11 in such a manner that they are confronted through the element 11 with the electrodes 15A, respectively. The electrodes 15A of the sensing sections 18, 23, 28 and 33 which are arranged on one of the two diagonal lines of the rectangular pyroelectric element 11, are connected in series to one another with connecting conductors 15C, and similarly the electrodes 15A of the sensing sections 21, 24, 27 and 30 which are arranged on the other diagonal line are connected in series to one another with connecting conductors 15C. The electrodes 15A of the sensing sections 19 and 22 are connected to each other with a connecting conductor 15C which is laid across the connecting conductor 15C which has been laid along the diagonal line. Similarly, the electrodes 15A of the sensing sections 20 and 25, 26 and 31, and 29 and 32 are connected to each other with connecting conductors 15C which are laid across the connecting conductors 15C which have been laid along the diagonal lines, respectively. Those connecting conductors 15C are welded together at the intersections, respectively. Four lead conductors 15D are extended from the electrodes 15A of the four sensing sections 18, 21, 30 and 33 located by the four corners of the pyroelectric element 11 towards the four corners, respectively. The electrodes 15A and 15B, the connecting conductors 15C, and the lead conductors 15D are formed by vapor deposition of NiCr, Ag, Ag—Cu, or the like. In the case where the electrodes 15A and 15B are of Ag or Ag—Cu, a black film is formed on the surface of each of the electrodes 15A, which absorbs heat with high efficiency.

Near the four corners of the pyroelectric element 11, the lead conductors 15D are fixedly connected to conductive parts such as solder bumps 16, which are provided on a circuit (not shown) formed on the substrate 9, by using substantially equal quantities of conductive paste 17.

The electrodes 15B of the sensing sections 18 through 33 are fixedly connected to the solder bumps 16, which are provided on the circuit on the substrate 9, by using the conductive paste 17. In this operation, the conductive paste 17 is used as follows: In fixing each of the electrode 15B of the sensing sections 18, 21, 30 and 33, a relatively large quantity of conductive paste 17 is used; and in fixing each of the electrodes 15B of the sensing sections 19, 20, 22, 25, 26, 29, 31 and 32, the quantity of conductive paste 17 used is smaller than that used in the fixing of each of the electrodes 15B of the sensing sections 18, 21, 30 and 33.

The conductive paste 17 used for each of the sensing sections 18 to 33 serves as a heat sink for heat generated thereat by infrared rays, and as a heat conduction path to the substrate 9. This improves the diffusion of heat from the sensing sections 18, 21, 30 and 33 which was heretofore difficult because of high thermal resistance, and further improves the diffusion of heat from the sensing sections 19, 20, 22, 25, 26, 29, 31 and 32, although the degree of improvement is smaller than in the case of the sensing sections 18, 21, 30 and 33. As a result, the charges produced by the sensing sections 18 through 33 of the pyroelectric element 11 have uniform; that is, the sensing sections 18 to 33 are less the variation in sensitivity.

The conductive paste 17 may be any paste which is conductive, such as conductive silicon, conductive epoxy resin, or conductive phenol resin.

Figures 7A, 7B:
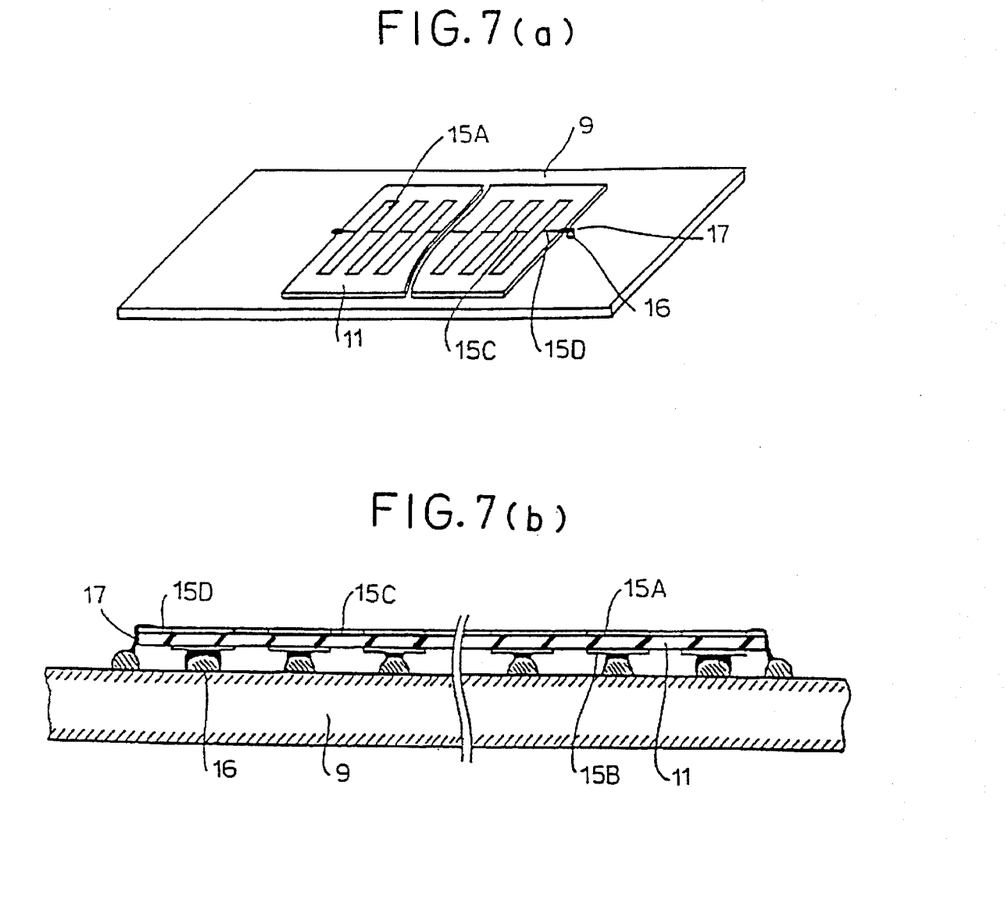
FIGS. 7(a) and 7(b) are a perspective view and a sectional view showing a current collection type infrared linear array sensor in which a pyroelectric element is mounted on a substrate according to a second embodiment of the invention, respectively.

FIGS. 7(a) and 7(b) show a pyroelectric infrared linear array sensor in accordance with a second embodiment. The sensor is different from the above-described conventional one only in a substrate 9 and a pyroelectric element 11. In the element 11, the sensing sections have the same reference numerals as those in the conventional sensor.

As shown in FIGS. 7(a) and 7(b), in the pyroelectric infrared linear array sensor having a plurality of sensing sections, electrodes 15A are arranged in a line at equal intervals on the upper surface of the pyroelectric element 11, and similarly electrodes 15B are arranged on the lower surface of the pyroelectric element 11 in such a manner that they are confronted through the element 11 with the electrodes 15A, respectively. The electrodes 15A on the upper surface of the element 11 are connected to one another with connecting conductors 15C. Two lead conductors 15D are extended respectively from the electrodes 15A of the two outermost sensing sections to respective ends of the pyroelectric element 11. The electrodes 15A and 15B, the connecting conductors 15C, and the lead conductors 15D are formed by vapor deposition of NiCr, Ag, Ag—Cu, or the like. In the case where the electrodes 15A and 15B are of Ag or Ag—Cu, a black film is formed on the surface of each of the electrodes 15A, which absorbs heat with high efficiency.

At the two ends of the pyroelectric element 11, the lead conductors 15D are fixedly connected to conductive parts such as solder bumps 16, which are provided on a circuit (not shown) formed on the substrate 9, by using substantially equal quantities of conductive paste 17.

The electrodes 15B of the sensing sections are fixedly connected to the solder bumps 16 provided on the circuit on the substrate 9, by using conductive paste 17. In this connection, in fixing each of the electrodes 15B of the two outermost sensing sections, a relatively large quantity of conductive paste 17 is used, and in fixing the electrodes 15B of the remaining sensing sections, the quantities of conductive paste 17 used are made smaller towards the middle sensing section, which further improves the diffusion of heat from the two outermost sensing sections of the pyroelectric element 11.

The quantities of conductive paste 17 serve as heat sinks for heat generated at the sensing sections by infrared rays, and as heat conduction paths to the substrate 9. This improves the diffusion of heat from the two outermost sensing sections of the pyroelectric element 11 which was heretofore difficult because of high thermal resistance. As a result, the charges produced by all the sensing sections of the pyroelectric element 11 are uniform; that is, the plurality of sensing sections are less variable in sensitivity.

The conductive paste 17 may be any paste which is conductive, such as conductive silicon, conductive epoxy resin, or conductive phenol resin.

The pyroelectric infrared array sensor of the invention designed as described above has the following effects or merits:

The pyroelectric element, on which a plurality of sensing sections are formed each of which is made up of a pair of electrodes confronted with each other, is fixedly secured to the substrate by using the conductive paste. The conductive paste thus used is utilized as a heat sink and a thermal conduction path to the substrate, which enhances the diffusion of heat generated at the sensing sections by infrared rays applied thereto, which heretofore was difficult. Hence, the charges produced by the plurality of sensing sections are uniform; that is, they are less variable in sensitivity.

The pyroelectric infrared two-dimensional array sensor is free from the difficulty accompanying the conventional one that it is necessary to adjust the amplification factors of the amplifier circuit with respect to the sensitivity of the sensing sections. Hence, the sensor is small in the number of manufacturing steps, and accordingly low in manufacturing cost.

In the pyroelectric infrared linear array sensor, it is unnecessary to provide the dummy sensing sections, which makes it possible to reduce the size of the pyroelectric element, and the size of the sensor, accordingly.

FIGS. 8(a) to 8(d) show the arrangement of components of a pyroelectric element in a pyroelectric infrared array sensor in accordance with a third embodiment of the invention.

In the sensor according to the third embodiment of the invention, a plurality of grounding electrodes 15A are arranged in a matrix form, or in a two-dimensional array, on the pyroelectric element 11, and are connected to a ground potential electrode on a substrate 9. For this purpose, a conductive adhesive agent 110 is applied to form connecting sections 111 of conductive adhesive agent.

A specific feature of this embodiment resides in that the connecting sections 111 are arranged symmetrically at least on the front and rear edges, on the right and left edges, or at both ends of the diagonal line or lines of the grounding electrode forming surface 115 of the pyroelectric element 11.

FIGS. 8(a) to 8(d) show examples of the pyroelectric element of the infrared array sensor according to the third embodiment. In the pyroelectric element 11, a plurality of grounding electrodes 15A (sixteen (16) grounding electrodes in FIGS. 8(a) to 8(d)) are formed in a two-dimensional array on the grounding electrode forming surface 115 of the pyroelectric element 11, thus providing sixteen (16) sensing sections. In the pyroelectric element 11, as in the conventional one, the grounding electrodes 15A are connected to the ground potential on the substrate 9. For simplification in description, the description of the conductive connection of the substrate 9 will be omitted.

Figure 8A:
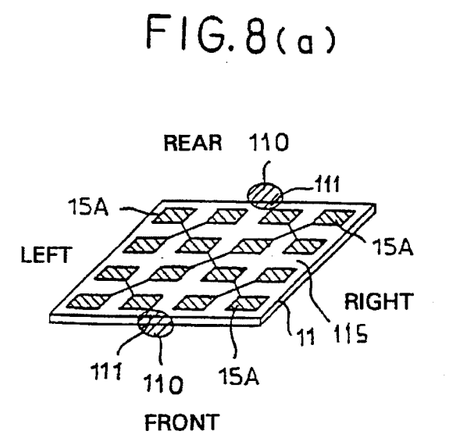
Figure 8B:
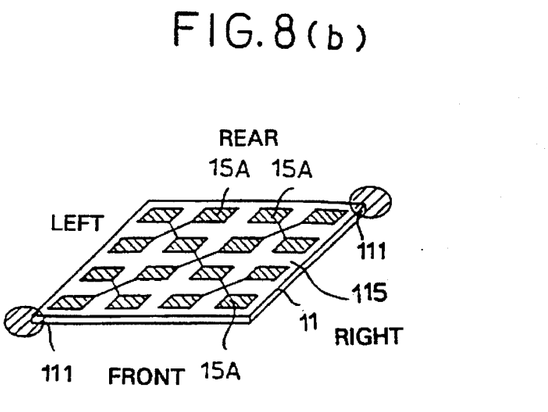
Figure 8C:
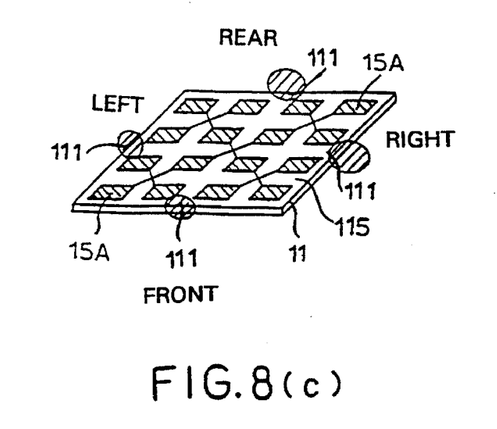
Figure 8D:
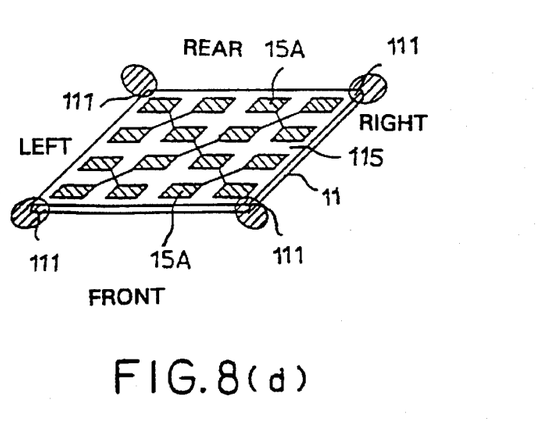

In the pyroelectric element shown in FIG. 8(a), two connecting sections 111 of conductive adhesive agent are provided symmetrically on the front and rear edges of the grounding electrode forming surface 115 of the pyroelectric element 11, respectively. The grounding electrodes 15A are connected to the ground potential of the substrate 9 by applying the conductive adhesive agent 110 to the connecting sections 111. In the pyroelectric element shown in FIG. 8(b), two connecting sections 111 of conductive adhesive agent are arranged symmetrically at both ends of one diagonal line of the grounding electrode forming surface 115 of the pyroelectric element 11, respectively. In the pyroelectric element shown in FIG. 8(c), two connecting sections 111 of conductive adhesive agent are provided symmetrically on the front and rear edges of the grounding electrode forming surface 115 of the pyroelectric element 11, respectively, and another two connecting sections 111 of conductive adhesive agent are provided symmetrically on the right and left edges of the grounding electrode forming surface 115 which are perpendicular to the front and rear edges, respectively. In the pyroelectric element shown in FIG. 8(d), two connecting sections 111 of conductive adhesive agent are provided symmetrically at both ends of one diagonal line of the grounding electrode forming surface 115 of the pyroelectric element 11, respectively; and another two connecting sections 111 of conductive adhesive agent are provided symmetrically at both ends of the other diagonal line of the grounding electrode forming surface 115, respectively.

In the embodiment, the connecting sections 111 of conductive adhesive agent are arranged symmetrically on the front and rear edges, on the right and left edges, or at both ends of the diagonal line or lines of the grounding electrode forming surface 115 of the pyroelectric element 11, and the conductive adhesive agent 110 is applied to the connecting sections 111 thus arranged. When the conductive adhesive agent 110 applied to each of the connecting sections 111 is affected in temperature by external thermal change, it is expanded or contracted. However, the stresses due to the expansion or contraction of the conductive adhesive agent 110 which are applied to connecting points of the solder bumps of the sensing sections are reduced and made substantially uniform because the connecting sections applied with the conductive adhesive agent are arranged symmetrically as was described above. This eliminates the difficulty accompanying the conventional infrared array sensor that the solder bumps of the sensing sections are cracked at the connecting points or come off, thus improving the reliability of the sensor.

Furthermore, as was described above, the stresses due to the expansion or contraction of the conductive adhesive agent 110 are uniformly distributed to and reduced at the connecting points of the solder bumps; that is, the stresses are less varied. This prevents the solder bumps from being cracked at the connecting points or coming off, thus maintaining the electrical conduction between the pyroelectric element and the substrate stable. Therefore, in the sensor, noise is never increased, and its sensitivity is never lowered.

Figure 9:
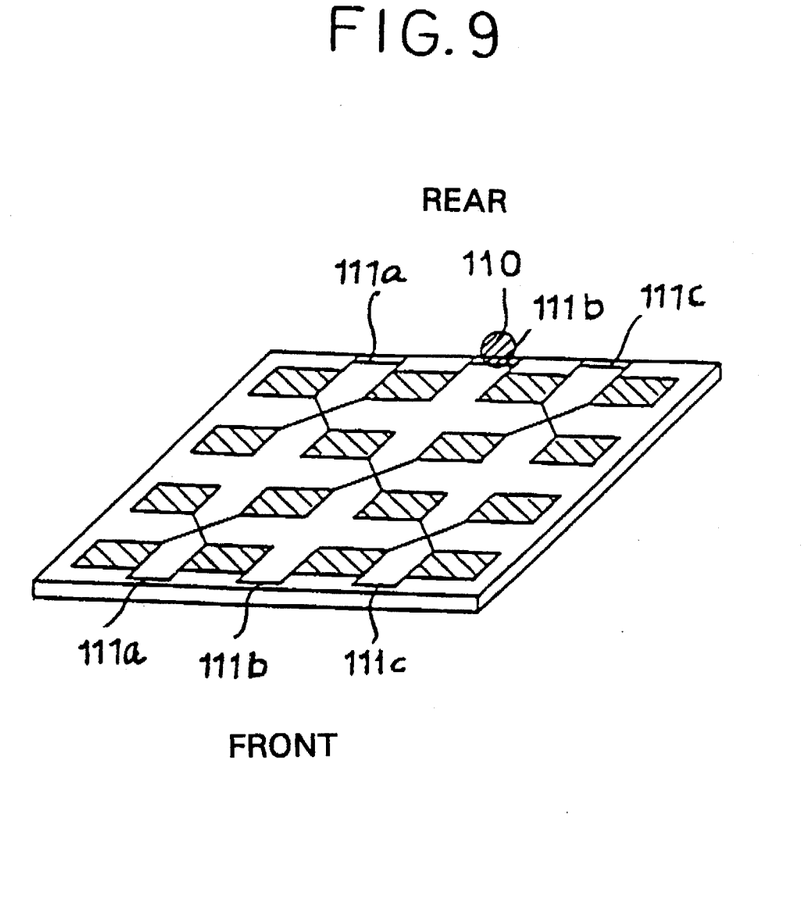
FIG. 9 is a perspective view showing a pyroelectric element according to a modification of the third embodiment of the invention.

While preferred embodiments of the invention have been described, it will be obvious to those skilled in the art that various changes and modifications may be made therein without departing from the invention. In the above-described embodiments, two connecting sections 111 of conductive adhesive agent are arranged symmetrically on the front and rear edges, or on the right and left edges, or at both ends of one diagonal line of the grounding electrode forming surface 115 of the pyroelectric element, respectively; or four connecting sections are arranged symmetrically on the front, rear, right and left edges, or at the four ends of the two diagonal lines of the grounding electrode forming surface 115, respectively. However, as shown in FIG. 9, a plurality of connecting sections 111a, 111b, and 111c of conductive adhesive agent may be provided at symmetrically positions 111a, 111b, and 111c on the front and rear edges of the grounding electrode forming surface 115; that is, the number of connecting sections 111 arranged symmetrical is not limited. In this case, the stresses applied to the picture elements are further averaged, which further improves the reliability of the connection to the solder bumps.

Furthermore, in the above-described embodiment, the pyroelectric element is formed by arranging sixteen (16=4× 4) picture elements in matrix form (two-dimensional array) on the pyroelectric element; however, the number of picture elements is not limited thereto or thereby. That is, the number of picture elements may be at least two which are arranged one-dimensionally; or may be twenty-five (25=5× 5) which are arranged two-dimensionally.

Moreover, in the above-described embodiment, the base material of the conductive adhesive agent 110 is epoxy resin, phenol resin or silicon resin; however, it may be acrylic resin; that is, it may be any base material which forms the conductive adhesive agent 110.

In the pyroelectric infrared array sensor of the embodiment, a plurality of connecting sections of conductive adhesive agent are arranged symmetrically at least on the front and rear edges, or on the right and left edges, or at both ends of a diagonal line of the grounding electrode forming surface of the pyroelectric element. When the connecting sections of conductive adhesive agent are affected by external thermal change, they are thermally expanded or contracted. When the pyroelectric element; i.e., the sensing sections are connected through the solder bumps to the substrate with the conductive adhesive agent, the stresses due to the expansion or contraction of the conductive adhesive agent which are applied to the connecting points of the solder pumps of the sensing sections are reduced and made substantially uniform, because the connecting sections applied with the conductive adhesive agent are arranged symmetrically as was described above. Thus, the pyroelectric infrared array sensor of the invention is free from the difficulties accompanying the conventional one that the solder bumps of the sensing sections are cracked at the connecting points or come off. That is, the sensor of the invention is high in reliability.

In the sensor of the invention, the stresses due to the expansion or contraction of the conductive adhesive agent are reduced and uniformly applied to the connecting points of the solder bumps of the sensing sections, which prevents the solder bumps of the sensing sections from being cracked at the connecting points or coming off; that is, the conduction between the pyroelectric element and the substrate is maintained at all times. Accordingly, in the sensor of the invention, noise is never increased, and its sensitivity is never lowered.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A pyroelectric infrared array sensor, comprising:
   a pyroelectric element including a plurality of sensing sections arranged two-dimensionally, each having upper and lower electrodes which are confronted with each other, said pyroelectric element producing charges according to heat generated by infrared rays applied thereto, said pyroelectric element having said upper electrodes on a light receiving surface;
   a substrate to which said pyroelectric element is fixedly secured;
   connecting conductors provided on said light receiving surface of said pyroelectric element for connecting said upper electrodes of said plurality of sensing sections to one another; and
   lead conductors provided on said light receiving surface of said pyroelectric element so as to extend from the upper electrodes of respective ones of said sensing sections which are located adjacent to edges of said light receiving surface;
   wherein said lead conductors and lower electrodes are fixedly connected to said substrate with conductive paste; and
   wherein said lead conductors are disposed respectively at corners of said pyroelectric element.

2. A pyroelectric infrared array sensor as claimed in claim 1, wherein said lead conductors are disposed respectively at each of four corners of said pyroelectric element.

3. A pyroelectric infrared array sensor, comprising:
   a pyroelectric element including a plurality of sensing sections arranged linearly, each having upper and lower electrodes which are confronted with each other, said pyroelectric element producing charges according to heat generated by infrared rays applied thereto, said pyroelectric element having said upper electrodes on a light receiving surface;
   a substrate to which said pyroelectric element is fixedly secured;
   connecting conductors provided on said light receiving surface of said pyroelectric element for connecting said upper electrodes of said plurality of sensing sections to one another; and
   lead conductors provided on said light receiving surface of said pyroelectric element so as to extend from the upper electrodes of respective ones of said sensing sections which are located adjacent to edges of said light receiving surface;
   wherein said lead conductors and lower electrodes are fixedly connected to said substrate with conductive paste; and
   wherein the quantities of conductive paste used for connecting said lower electrodes to said substrate are made smaller towards a middle sensing section.

4. A pyroelectric infrared array sensor, comprising:
   a pyroelectric element including a plurality of sensing sections arranged two-dimensionally, each having upper and lower electrodes which are confronted with each other, said pyroelectric element producing charges according to heat generated by infrared rays applied thereto, said pyroelectric element having said upper electrodes on a light receiving surface;
   a substrate to which said pyroelectric element is fixedly secured;
   connecting conductors provided on said light receiving surface of said pyroelectric element for connecting said upper electrodes of said plurality of sensing sections to one another; and
   lead conductors provided on said light receiving surface of said pyroelectric element so as to extend from the upper electrodes of respective ones of said sensing sections which are located adjacent to edges of said light receiving surface;
   wherein said lower electrodes are fixedly connected to said substrate with conductive paste;
   said array sensor further comprising:
      external ground potential electrodes formed on said substrate; and
      a plurality of connecting sections made of conductive paste fixedly connecting said lead conductors to said ground potential electrodes;
      wherein said plurality of connecting sections are arranged symmetrically on both of front and rear edges of said pyroelectric element.

5. A pyroelectric infrared array sensor as claimed in claim 4,
wherein said plurality of connecting sections are further arranged on both of right and left edges of said pyroelectric element.

6. A pyroelectric infrared array sensor as claimed in claim 5, wherein said plurality of connecting sections are arranged symmetrically on said right and left edges.

7. A pyroelectric infrared array sensor as claimed in claim 4, wherein a respective one of said plurality of connecting sections is arranged on each of said front and rear edges.

8. A pyroelectric infrared array sensor as claimed in claim 4, wherein a respective plurality of said plurality of connecting sections are arranged on each of said front and rear edges.

9. A pyroelectric infrared array sensor, comprising:
a pyroelectric element including a plurality of sensing sections arranged two-dimensionally, each having upper and lower electrodes which are confronted with each other, said pyroelectric element producing charges according to heat generated by infrared rays applied thereto, said pyroelectric element having said upper electrodes on a light receiving surface;
a substrate to which said pyroelectric element is fixedly secured;
connecting conductors provided on said light receiving surface of said pyroelectric element for connecting said upper electrodes of said plurality of sensing sections to one another; and
lead conductors provided on said light receiving surface of said pyroelectric element so as to extend from the upper electrodes of respective ones of said sensing sections which are located adjacent to edges of said light receiving surface;
wherein said lower electrodes are fixedly connected to said substrate with conductive paste;
said array sensor further comprising:
external ground potential electrodes formed on said substrate; and
a plurality of connecting sections made of conductive paste fixedly connecting said lead conductors to said ground potential electrodes;
wherein said plurality of connecting sections are arranged at both ends of at least one diagonal line of said pyroelectric element.

10. A pyroelectric infrared array sensor as claimed in claim 9, wherein additional ones of said plurality of connecting sections are arranged at both ends of a second diagonal line of said pyroelectric element.

11. A pyroelectric infrared array sensor, comprising:
a pyroelectric element including a plurality of sensing sections arranged two-dimensionally, each having upper and lower electrodes which are confronted with each other, said pyroelectric element producing charges according to heat generated by infrared rays applied thereto, said pyroelectric element having said upper electrodes on a light receiving surface;
a substrate to which said pyroelectric element is fixedly secured;
connecting conductors provided on said light receiving surface of said pyroelectric element for connecting said upper electrodes of said plurality of sensing sections to one another; and
lead conductors provided on said light receiving surface of said pyroelectric element so as to extend from the upper electrodes of respective ones of said sensing sections which are located adjacent to edges of said light receiving surface;
wherein said lead conductors and lower electrodes are fixedly connected to said substrate with conductive paste; and
wherein the quantity of the conductive paste used for fixedly connecting said lower electrodes at corners of said pyroelectric element to said substrate is larger than that used for fixedly connecting said lower electrodes at other portions of said pyroelectric element to said substrate.

12. A pyroelectric infrared array sensor as claimed in claim 11, wherein said lead conductors are disposed respectively at each of four corners of said pyroelectric element.

13. A pyroelectric infrared array sensor as claimed in claim 11, wherein said larger quantity of conductive paste is used for fixedly connecting said lower electrodes to said substrate at four corners of said pyroelectric element.

14. A pyroelectric infrared array sensor, comprising:
a pyroelectric element including a plurality of sensing sections arranged two-dimensionally, each having upper and lower electrodes which are confronted with each other, said pyroelectric element producing charges according to heat generated by infrared rays applied thereto, said pyroelectric element having a light receiving surface;
a substrate to which said pyroelectric element is fixedly secured;
connecting conductors provided on said light receiving surface of said pyroelectric element for connecting said upper electrodes of said plurality of sensing sections to one another; and
lead conductors provided on said light receiving surface of said pyroelectric element so as to extend from the upper electrodes of respective ones of said sensing sections which are located adjacent to edges of said light receiving surface;
wherein said lower electrodes are fixedly connected to said substrate with conductive paste;
said array sensor further comprising:
external ground potential electrodes formed on said substrate; and
a plurality of connecting sections made of conductive paste fixedly connecting said lead conductors to said ground potential electrodes;
wherein said plurality of connecting sections are arranged symmetrically on a pair of opposite edges of said pyroelectric element.

15. A pyroelectric infrared array sensor as claimed in claim 14, wherein said pair of opposite edges are left and right edges.

* * * * *